(12) United States Patent
Chen (10) Patent No.: US 9,418,931 B2
(45) Date of Patent: Aug. 16, 2016

(54) PACKAGE STRUCTURE AND MANUFACTURING METHOD THEREOF

(71) Applicant: Subtron Technology Co., Ltd., Hsinchu County (TW)

(72) Inventor: Chien-Ming Chen, Hsinchu County (TW)

(73) Assignee: Subtron Technology Co., Ltd., Hsinchu County (TW)

(*) Notice: Subject to any disclaimer, the term of this patent is extended or adjusted under 35 U.S.C. 154(b) by 0 days.

(21) Appl. No.: 14/675,761

(22) Filed: Apr. 1, 2015

(65) Prior Publication Data
US 2016/0155702 A1    Jun. 2, 2016

(30) Foreign Application Priority Data

Dec. 2, 2014  (TW) .............................. 103141782 A (51) Int. Cl.
| H01L 23/52 | (2006.01) |
| H01L 23/522 | (2006.01) |
| H01L 21/768 | (2006.01) |
| H01L 21/56 | (2006.01) |
| H01L 23/29 | (2006.01) |

(52) U.S. Cl.
CPC .......... *H01L 23/5226* (2013.01); *H01L 21/568* (2013.01); *H01L 21/76877* (2013.01); *H01L 23/293* (2013.01)

(58) Field of Classification Search
CPC .............. H01L 23/5226; H01L 21/568; H01L 21/76877; H01L 23/293
USPC ....................................................... 257/774
See application file for complete search history.

(56) References Cited

U.S. PATENT DOCUMENTS

| 2009/0194869 A1* | 8/2009 | Eom ..................... H01L 23/367 257/712 |
| 2010/0072588 A1 | 3/2010 | Yang |
| 2015/0096789 A1* | 4/2015 | Kim ...................... H05K 1/185 174/251 |

FOREIGN PATENT DOCUMENTS

| TW | 424308 | 3/2001 |
| TW | 200910558 | 3/2009 |
| TW | 201227884 | 7/2012 |

OTHER PUBLICATIONS

"Office Action of Taiwan Counterpart Application", issued on Apr. 18, 2016, p. 1-p. 10, in which the listed references were cited.

* cited by examiner

*Primary Examiner* — Xinning Niu
*Assistant Examiner* — Vu A Vu
(74) *Attorney, Agent, or Firm* — Jianq Chyun IP Office (57) ABSTRACT

A manufacturing method of a package structure includes the following steps. A substrate including a core layer, first and second patterned metal layers is provided. The first and second patterned metal layers are respectively disposed on two opposite surfaces of the core layer. A through cavity penetrating the substrate is formed. The substrate is disposed on a tape carrier. A semiconductor component is disposed in the through cavity. An inner wall of the through cavity and a side surface of the semiconductor component define a groove. The filling compound is dispensed above the groove. A heating process is performed for the filling compound to flow toward the tape carrier and comprehensively fill the groove. First and second stacked layers are respectively laminated onto the first and second patterned metal layers and cover at least a part of the semiconductor component.

20 Claims, 15 Drawing Sheets

PACKAGE STRUCTURE AND MANUFACTURING METHOD THEREOF

CROSS-REFERENCE TO RELATED APPLICATION

This application claims the priority benefit of Taiwan application serial no. 103141782, filed on Dec. 2, 2014. The entirety of the above-mentioned patent application is hereby incorporated by reference herein and made a part of this specification.

BACKGROUND OF THE INVENTION

1. Field of the Invention

The invention relates to a semiconductor structure and a manufacturing method thereof, and relates particularly to a semiconductor package structure and a manufacturing method thereof.

2. Description of Related Art

Typically, a circuit board comprises mainly of a plurality of layers of alternately stacked patterned circuit layers and dielectric layers, wherein the patterned circuit layers may be formed, for example, by a copper foil which has undergone processes such as photolithography and etching, and the dielectric layer is then disposed between the patterned circuit layers to isolate the patterned circuit layer of each layer. In addition, the stacked patterned circuit layers are mutually connected electrically by a plated through hole (PTH) or a conductive via penetrating the dielectric layer. Lastly, various types of electronic components are disposed on the surface of the circuit board (for example an active component, passive component and the like), and achieves a purpose of electrical signal propagation via the circuit design of the internal circuit.

However, along with the markets demand for electronic products needing to be compact in size and portably convenient, therefore in current electronic products, designs with electronic components already soldered to the circuit board to be embedded in the circuit board as an embedded component, and therefore may increase the layout area of the substrate surface, to achieve a purpose of thinner electronic products. However, in conventional embedded chip technology, a receiving groove needs to first be formed on the substrate, for the chip to be disposed in the receiving groove of the substrate. Then, a step for filling an insulation compound is performed, to embed the chip in the substrate. However, the insulation compound typically is in a cured state that is not easily deformed after being treated by high temperature curing, and therefore frequently results in many unfilled spaces between the embedded component and the insulation compound, and the spaces not only easily affect the binding of the substrate with the embedded component during lamination, but also affects the positioning of the embedded component with the contacts during lamination.

SUMMARY OF THE INVENTION

Accordingly, the present invention is directed to a package structure which has a higher product yield rate.

The present invention is further directed to a manufacturing method of a package structure for manufacturing the package structure.

The present invention provides a manufacturing method of a package structure includes the following steps. First, a substrate is provided. The substrate includes a core layer, a first patterned metal layer and a second patterned metal layer. The first patterned metal layer and the second patterned metal layer are respectively disposed on two opposite surfaces of the core layer. Then, a through cavity is formed for penetrating the substrate. Next, the substrate is disposed on a tape carrier. Then, a semiconductor component is disposed in the through cavity and positioned on the tape carrier. An inner wall of the through cavity and a side surface of the semiconductor device jointly define a groove. A filling compound is dispensed above the groove. A heating process is performed for the filling compound to flow toward the tape carrier and comprehensively fill the groove. A first stacked layer is laminated onto the substrate towards the first patterned metal layer. The first stacked layer covers at least a part of the semiconductor component. The tape carrier is removed. A second stacked layer is laminated onto the substrate towards the second patterned metal layer. The second stacked layer covers at least a part of the semiconductor component.

The present invention provides a package structure of the invention includes a substrate, a semiconductor component, a filling compound, a first stacked layer and a second stacked layer. The substrate has a through cavity, a core layer, a first patterned metal layer and a second patterned metal layer. The first patterned metal layer and the second patterned metal layer are respectively disposed on two opposite surfaces of the core layer. The through cavity penetrates the core layer, the first patterned metal layer and the second patterned metal layer. A semiconductor component is disposed in the through cavity. An inner wall of the through cavity and a side surface of the semiconductor component jointly define a groove, wherein a width of the groove substantially ranges from 50 μm to 100 μm. A filling compound is comprehensively filled in the groove. A first stacked layer is disposed on the first patterned metal layer and covers at least a part of the core layer and the semiconductor component. A second stacked layer is disposed on the second patterned metal layer and covers at least a part of the core layer and the semiconductor component.

Based on the above, the invention utilizes the characteristic of increasing mobility of a filling compound after heating to dispense the filling compound above a groove defined by the semiconductor component and the through cavity, such that when the heating process is performed, the filling component dispensed above the groove flows down to uniformly and comprehensively fill the groove with narrow width. Thereby, the known problem of the filling compound not easily filling a groove between the semiconductor component and the through cavity can be prevented, so as to enhance the bonding between the substrate and the semiconductor component, and further enhance product yield.

To make the above features and advantages of the invention clearer and easier to understand, embodiments will be examined below, with a detailed description accompanied with drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1O are cross-sectional schematic views illustrating processes for a manufacturing method of a package structure according to an embodiment of the invention.

DESCRIPTION OF THE EMBODIMENTS

Reference will now be made in detail to the present preferred embodiments of the invention, examples of which are illustrated in the accompanying drawings. The aforementioned features, effects and other technical content relating to the invention can be implemented with the detailed description of the embodiments below accompanied with drawings. The up, down, front, back, left and right directions referred to in the embodiments below, are for description purposes only, and should not be construed as a limitation to the invention. Wherever possible, the same reference numbers are used in the drawings and the description to refer to the same or like parts.

Figure 1A:
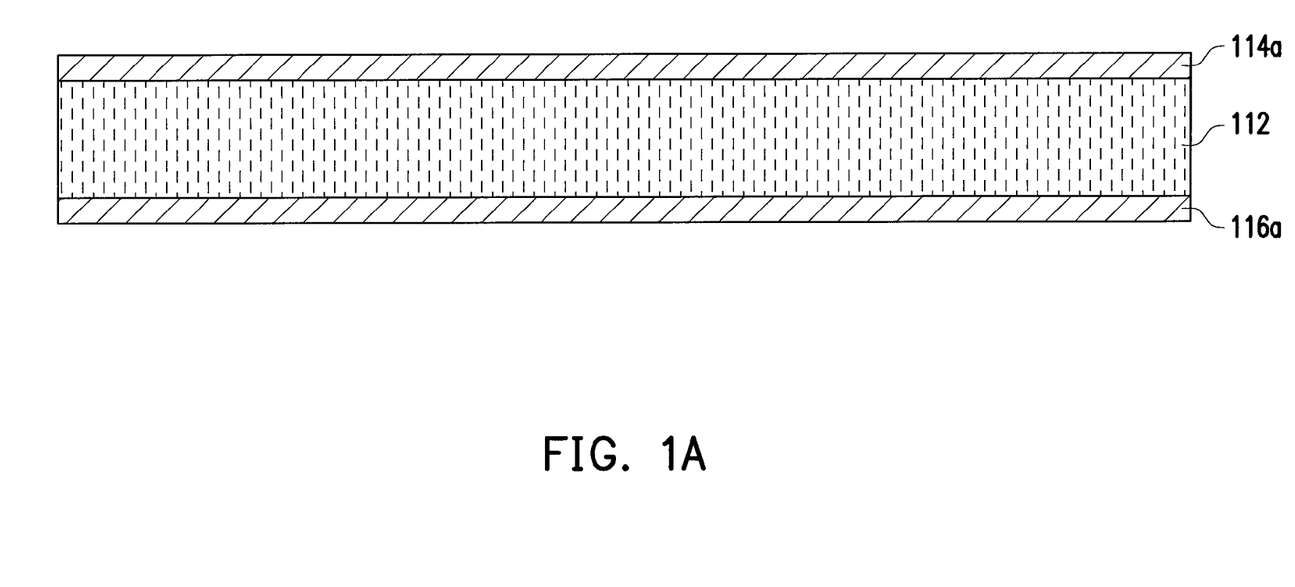
Figure 1B:
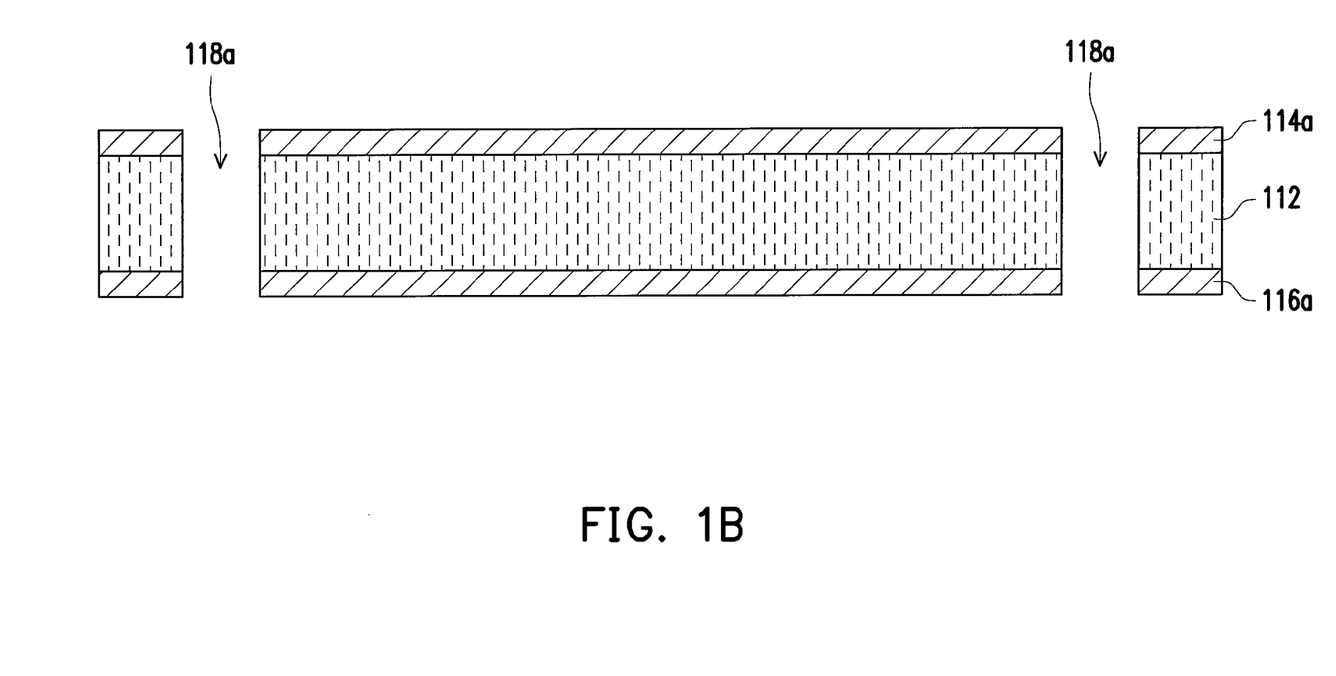
Figure 1C:
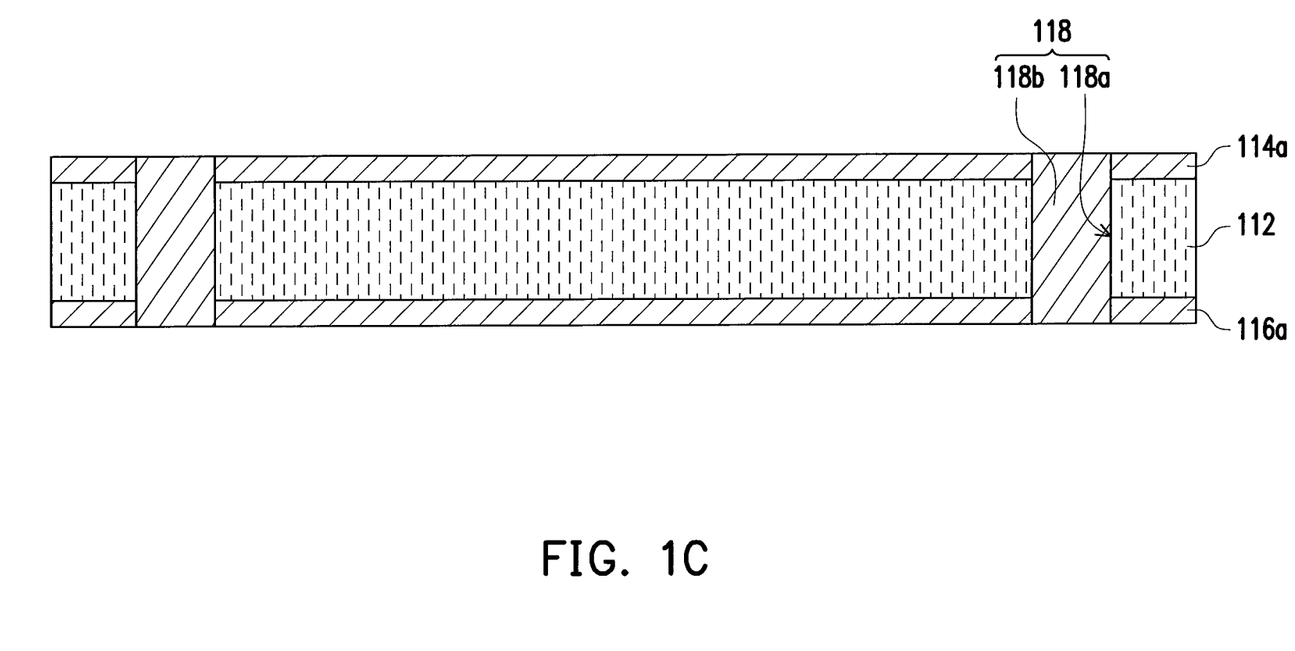
Figure 1D:
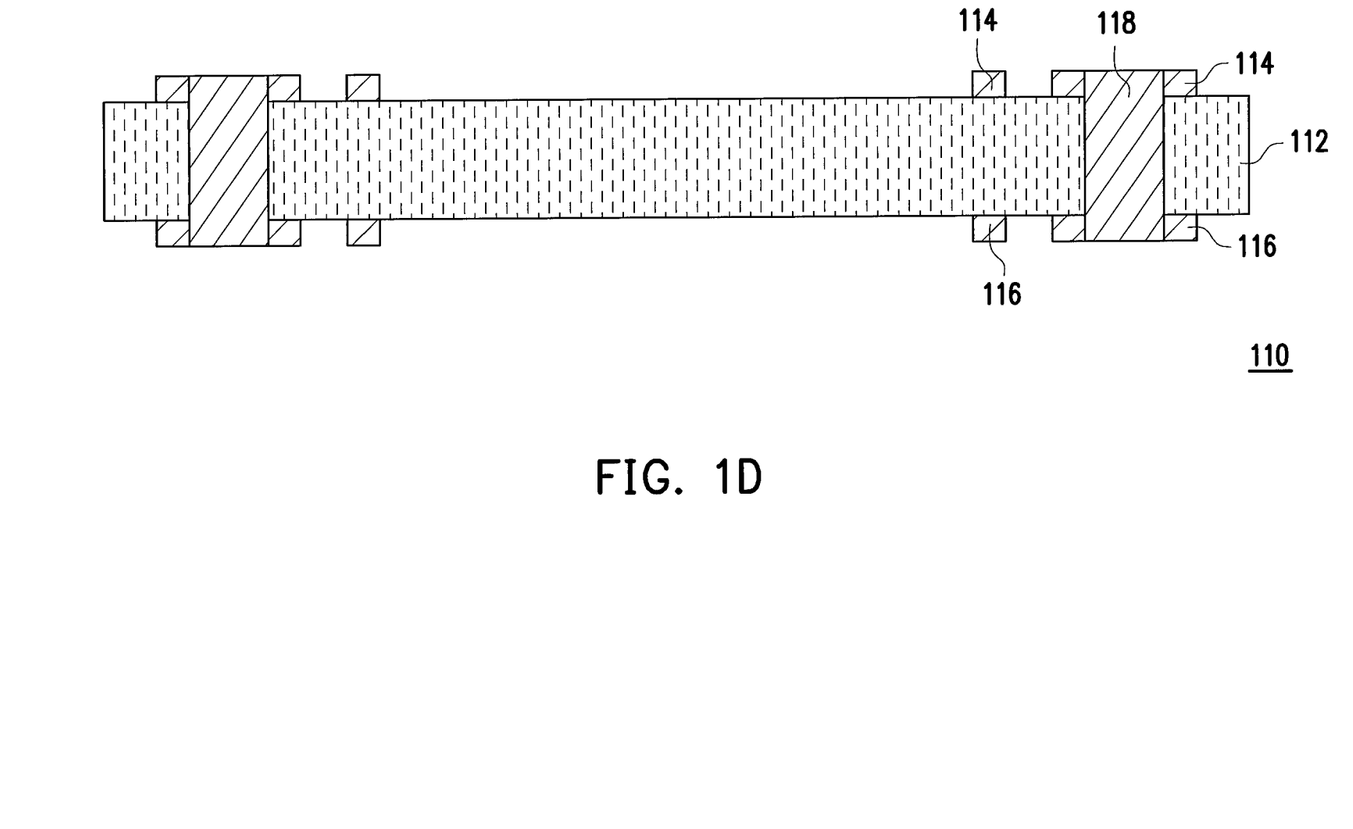

FIG. 1A to FIG. 1O are cross-sectional schematic views of processes for a manufacturing method of a package structure according to an embodiment of the invention. The manufacturing method of a package structure of the present embodiment includes the following steps. Firstly, a substrate is provided. More specifically, a manufacturing method of the above-mentioned substrate may include the following steps. For example, a core layer 112 as shown in FIG. 1A is firstly provided. Then, a first metal layer 114a and a second metal layer 116a are respectively laminated on two opposite surfaces of the core layer 112. In the present embodiment, the first metal layer 114a and the second metal layer 116a may be copper foils; however it should not be construed as a limitation to the invention. Next, a plurality of via holes 118a are formed as shown in FIG. 1B, wherein the via holes 118a penetrate the core layer 112, the first metal layer 114a and the second metal layer 116a. Then, the via holes 118a are filled with a conductive layer 118b to form a plurality of conductive pillars 118 that are electrically conductive. Thereby, the conductive pillars 118 electrically connect the first metal layer 114a and the second metal layer 116a. Then, a patterning process is performed on the first metal layer 114a and the second metal layer 116a to form the first patterned metal layer 114 and the second patterned metal layer 116 as shown in FIG. 1D. As such, the substrate 110 as shown in 1D is formed.

Figure 1E:
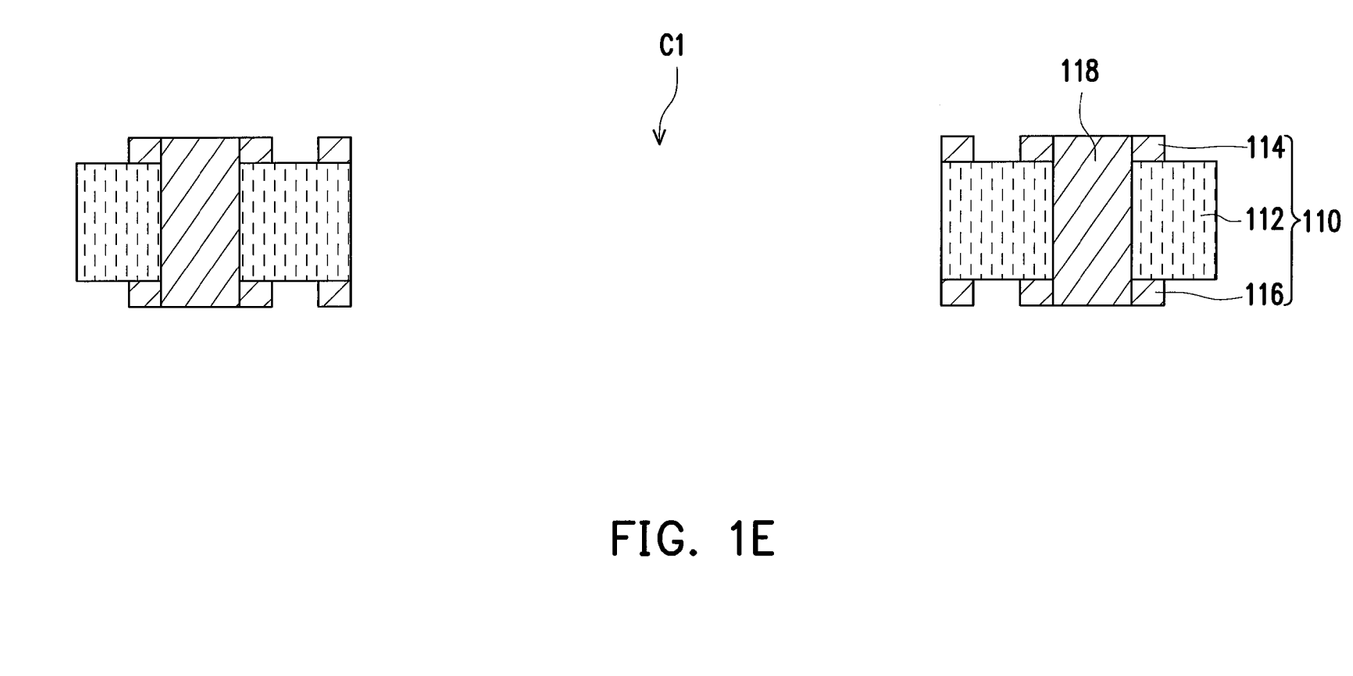
Figure 1F:
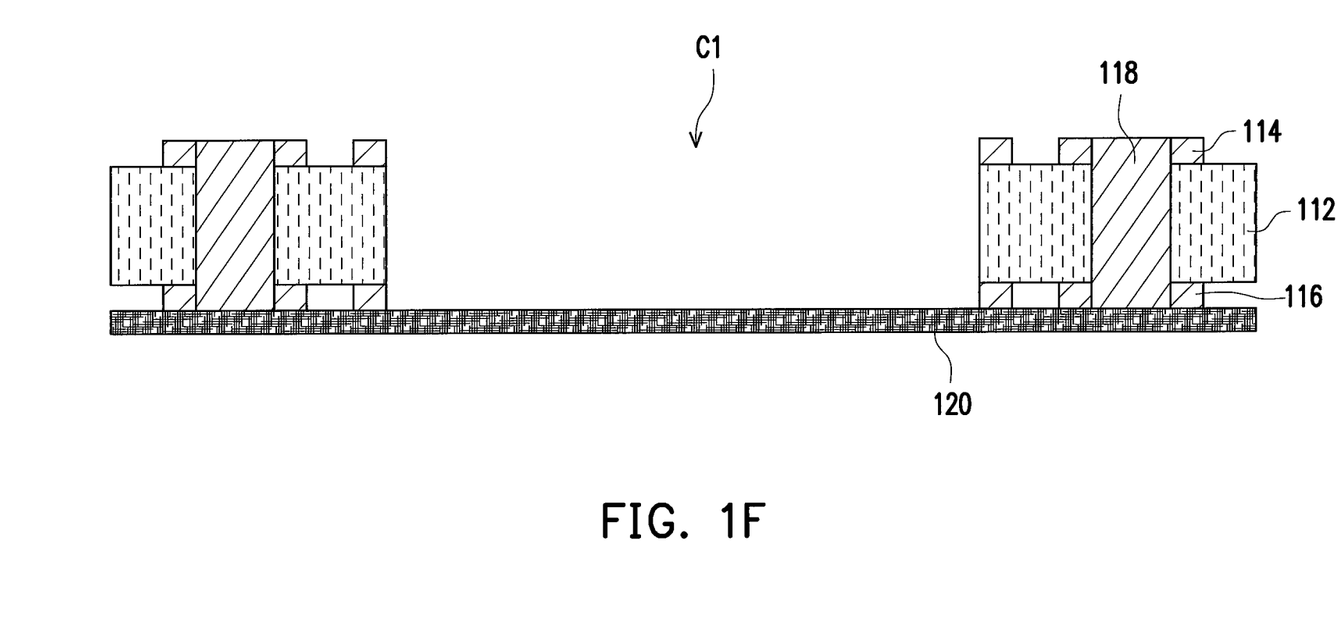
Figure 1G:
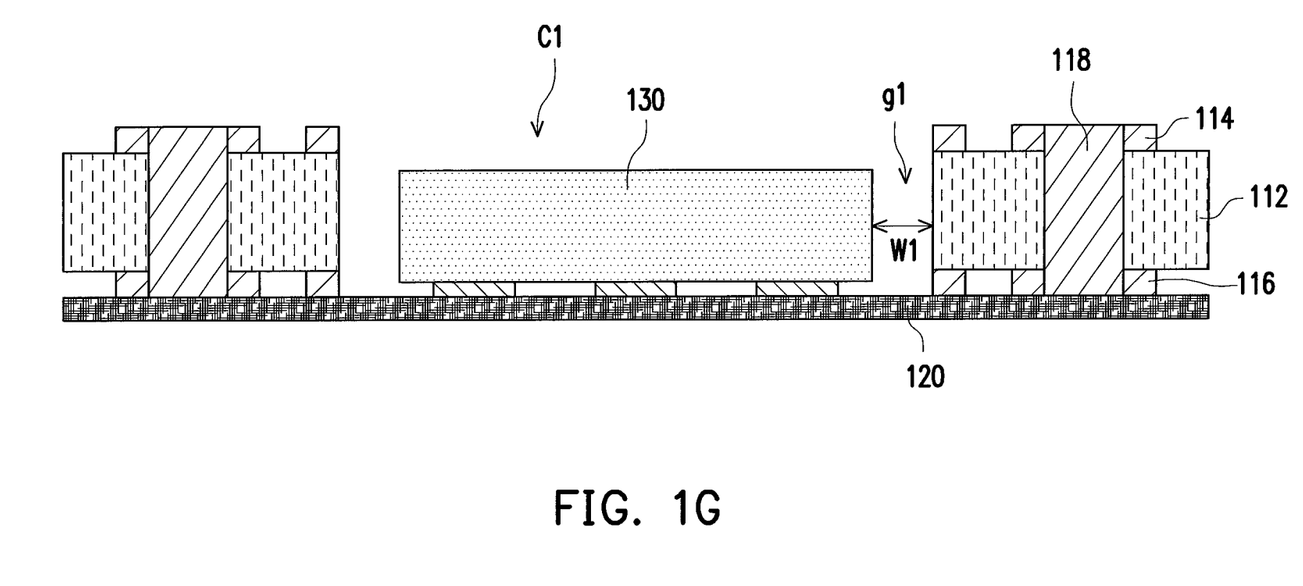

Referring to FIG. 1E, a through cavity C1 penetrating the substrate 110 is formed, which means the through cavity C1 penetrating the core layer 112, the first patterned metal layer 114 and the second patterned metal layer 116. Then, referring to FIG. 1F, the above-mentioned structure is disposed on a tape carrier 120. Then, a semiconductor component 130 is disposed in the through cavity C1 as shown in FIG. 1G, and the semiconductor device 130 is disposed on the tape carrier 120, wherein an inner wall of the through cavity C1 and a side surface of the semiconductor component 130 jointly define a groove g1.

In the present embodiment, the width w1 of the groove g1 substantially ranges from 50 μm to 100 μm, and the depth d1 of the groove g1 ranges substantially from 100 μm to 300 μm. That is to say, the distance between the side surface of the semiconductor component 130 and the inner wall of the through cavity C1 are very close, so the groove g1 is very narrow and deep. Of course, the values disclosed in the present embodiment are merely used for illustration and should not be construed as a limitation to the invention. More specifically, the depth d1 of the groove g1 actually may be the thickness of the substrate, which is the sum of the thicknesses of the first patterned metal layer 114, the core layer 112 and the second patterned metal layer 116.

Figure 1H:
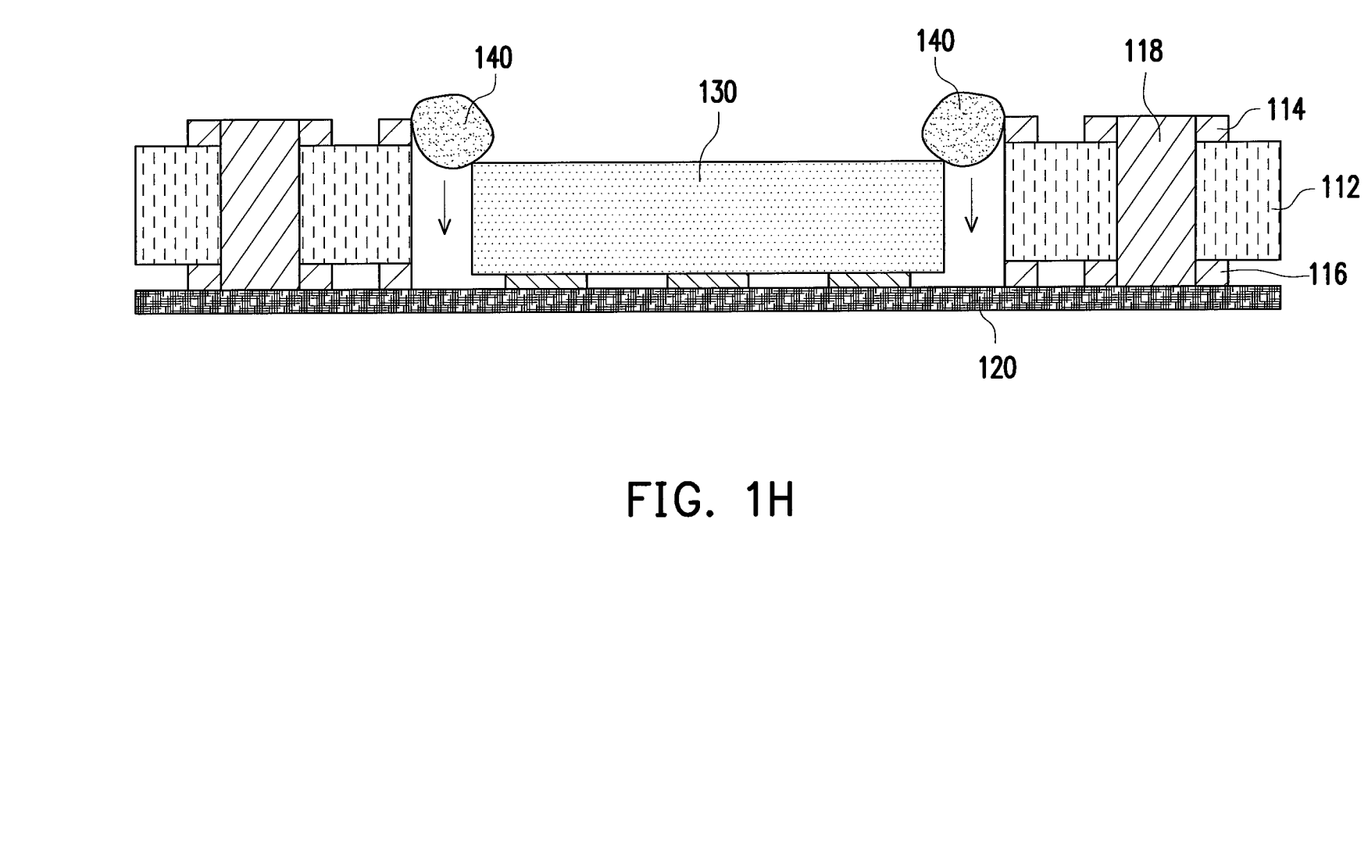
Figure 1I:
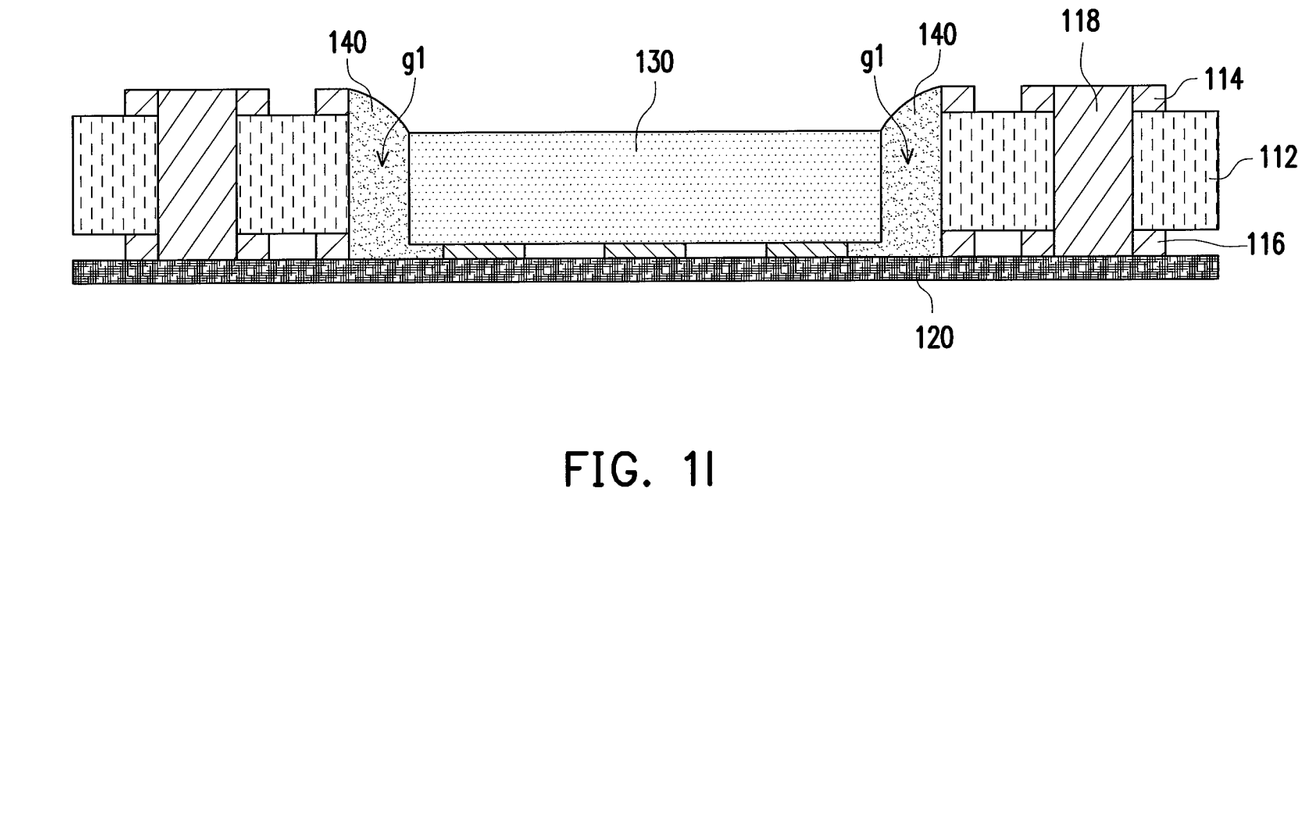

Referring to FIG. 1H and FIG. 1I, a filling compound 140 is dispensed above the groove g1. Next, a heating process is performed for the filling compound 140 to flow along the arrow shown in FIG. 1H towards the tape carrier 120, such that the filling compound 140 fills in the groove g1 comprehensively as shown in FIG. 1I. In the present embodiment, a material of the filling compound 140 may include epoxy and filling material, and a material of the filling material may include $SiO_2$ or other suitable material. In this way, the filling compound 140 of the present embodiment may utilize the characteristic of increasing mobility of the filling compound after heating to dispense the filling compound above a groove defined by the semiconductor component and the through cavity, such that when the heating process is performed, the filling compound 140 can be uniformly and comprehensively filled into the groove g1 with narrow width. The known problem of the filling compound not easily filling a groove between the semiconductor component and the through cavity can also be prevented, so as to enhance the bonding between the substrate and the semiconductor component, and further enhance the product yield. In the present embodiment, a heating temperature of the heating process ranges substantially from 80 degrees to 100 degrees Celsius.

Figure 1J:
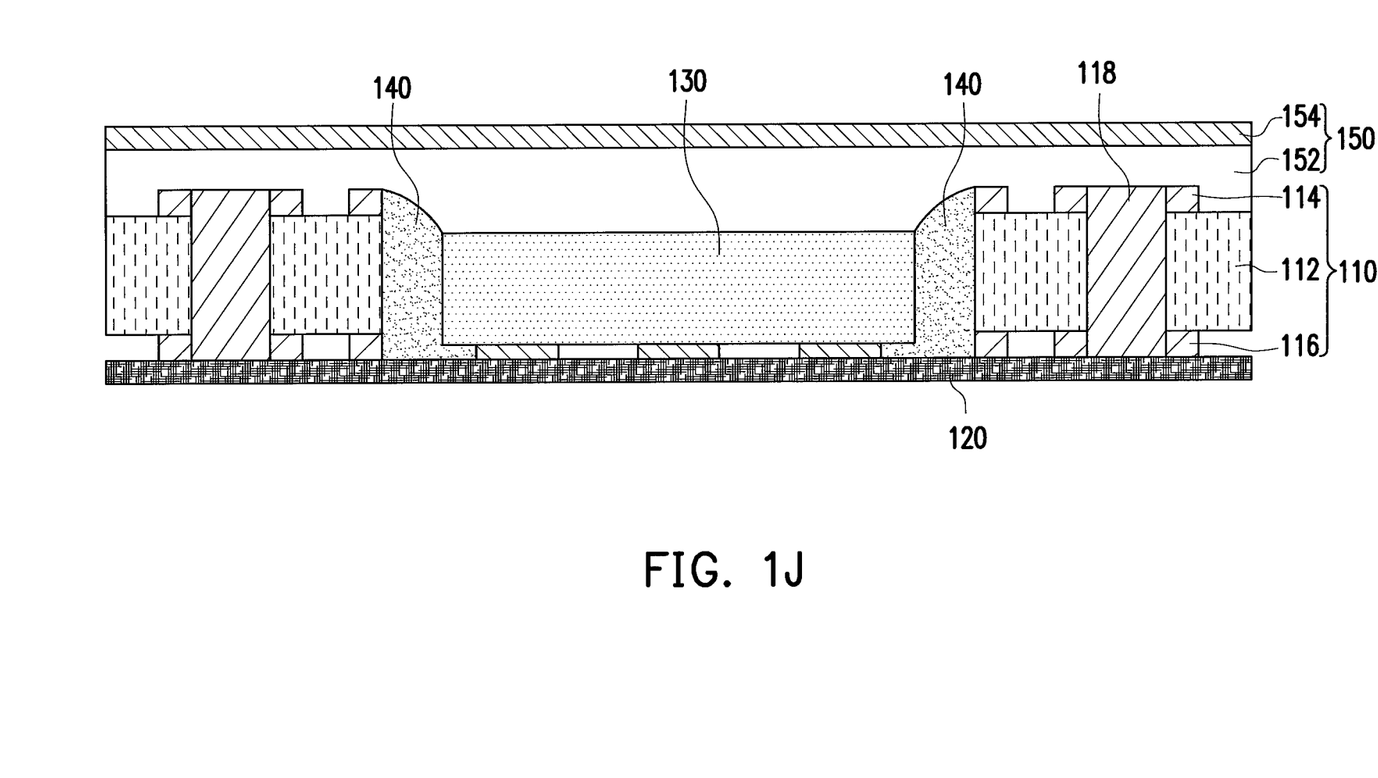
Figure 1K:
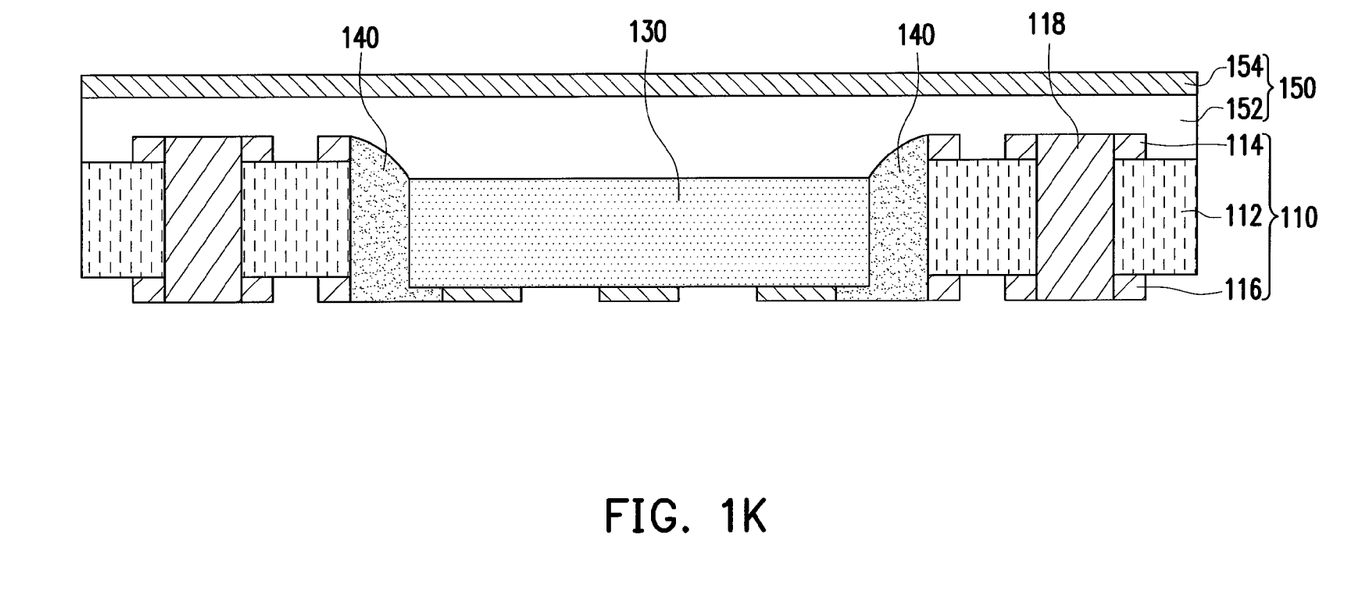
Figure 1L:
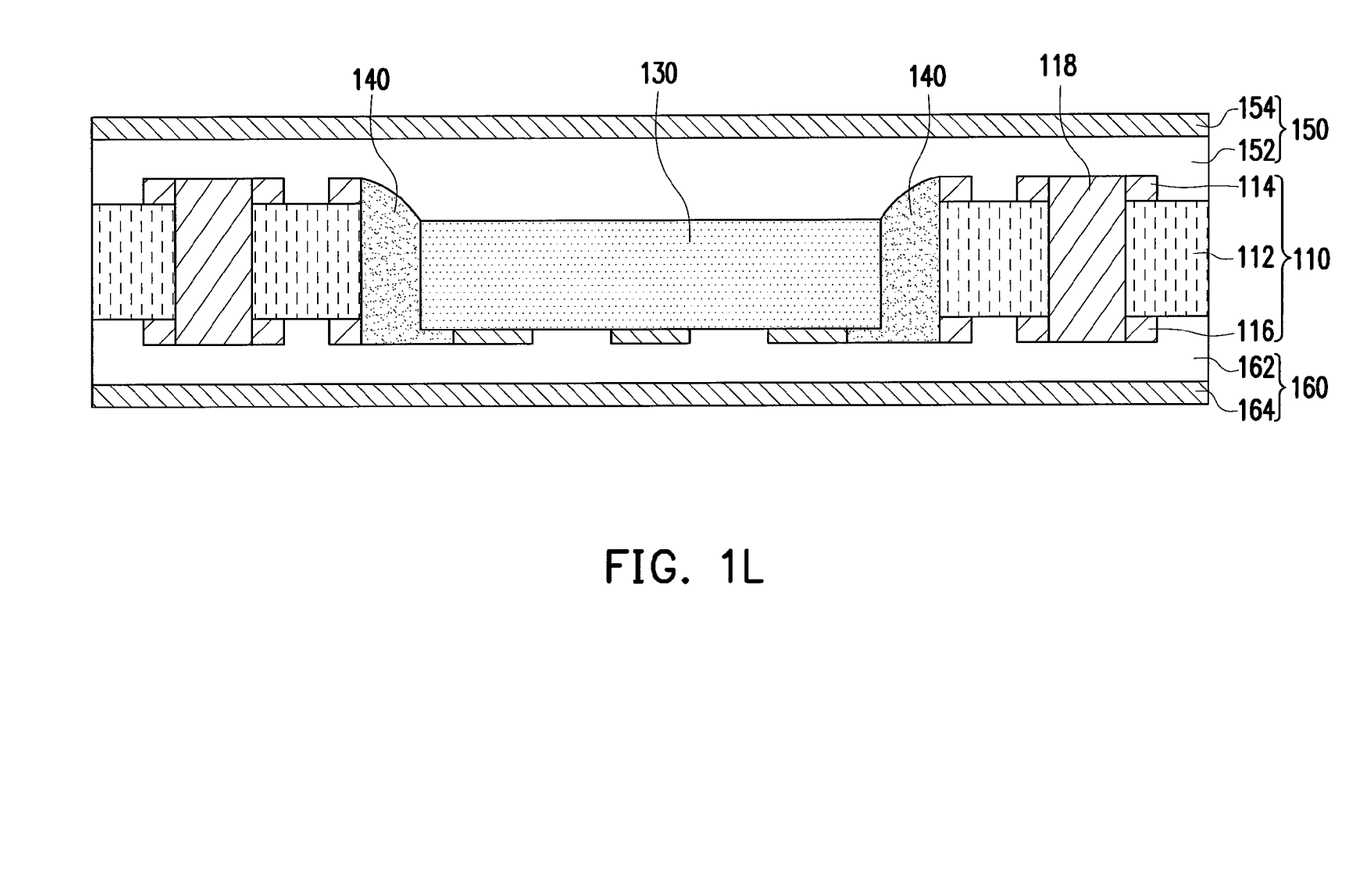

Next, referring to FIG. 1J and FIG. 1K, a first stacked layer 150 is laminated onto the substrate 110 towards the first patterned metal layer 114. The first stacked layer 150 covers at least a part of the semiconductor component 130. More specifically, the first stacked layer 150 includes a first dielectric layer 152 and a first circuit layer 154, and the first stacked layer 150 has the first dielectric layer 152 thereof cover at least a part of the semiconductor component 130. Then, the tape carrier 120 is removed as shown in FIG. 1J to expose bottom surfaces of the semiconductor component 130 and the substrate 110 as shown in FIG. 1K. Next, as shown in FIG. 1L, a second stacked layer 160 is laminated onto the substrate 110 towards the second patterned metal layer 116. The second stacked layer 160 covers at least a part of the semiconductor component 130. More specifically, the second stacked layer 160 includes a second dielectric layer 162 and a second circuit layer 164, and the second stacked layer 160 has the second dielectric layer 162 thereof cover at least a part of the semiconductor component 130.

Figure 1M:
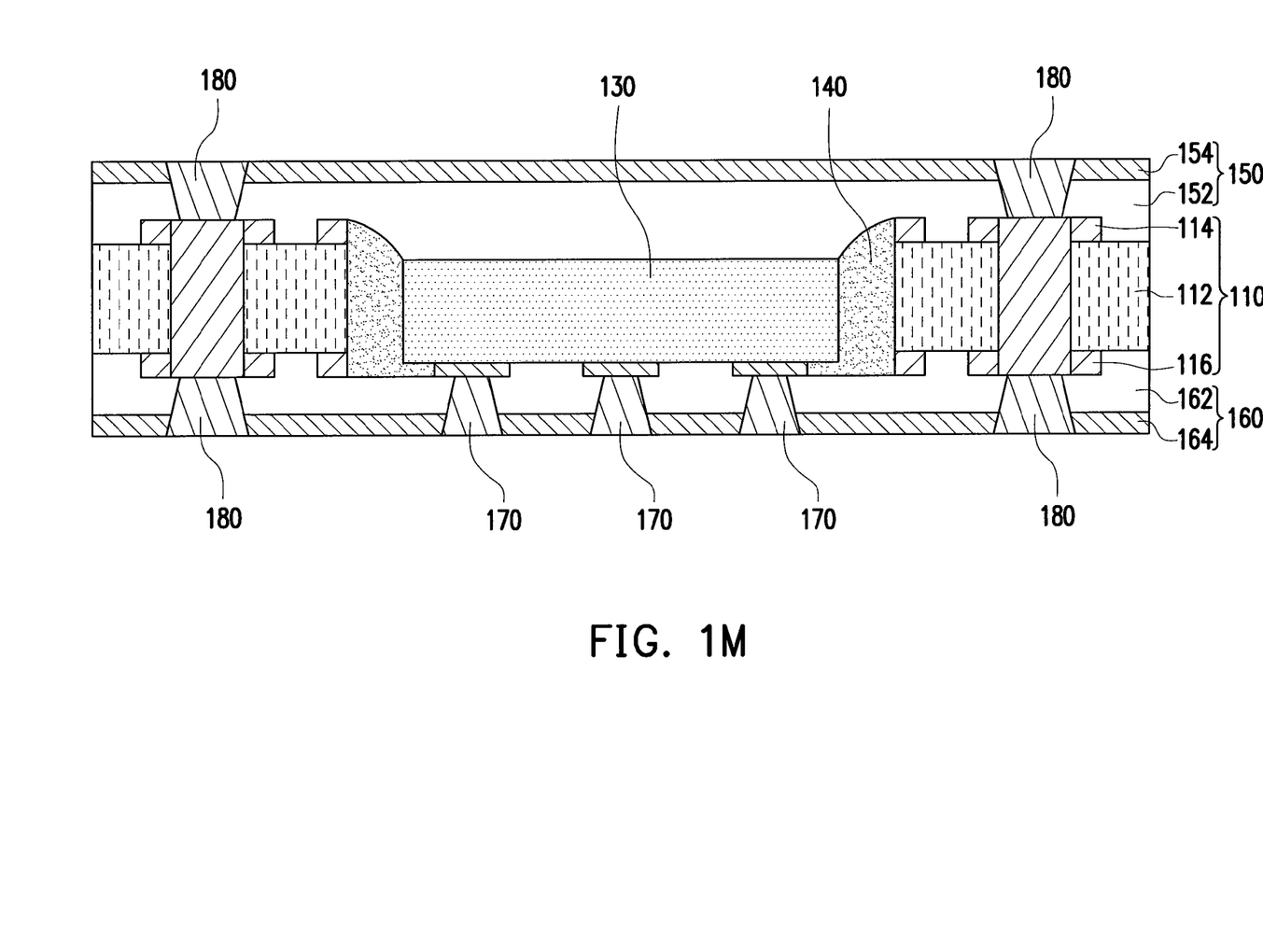

Referring to FIG. 1M, a plurality of first conductive vias 170 are formed. The above-mentioned first conductive vias 170 electrically connect the semiconductor component 130 to the first circuit layer 154 or the second circuit layer 164. The semiconductor component 130 may be an active component or a passive component, and the type of the semiconductor component should not be construed as a limitation to the invention. In the present embodiment, the semiconductor component 130 may be an active component, and an active surface thereof faces the second circuit layer 164, and the first conductive vias 170 then electrically connect the semiconductor component 130 and the second circuit layer 164. Of course, the present embodiment is only to describe an example, and should not be construed as a limitation to the invention. In other embodiments of the invention, the active surface of the semiconductor component 130 also may face the first circuit layer 154, and the first conductive vias 170 then electrically connect the semiconductor component 130 and the first circuit layer 154. In addition, the present embodiment may further have a plurality of second conductive vias 180 formed, to electrically connect the conductive pillars 118 to the first circuit layer 154 and the second circuit layer 164.

Figure 1N:
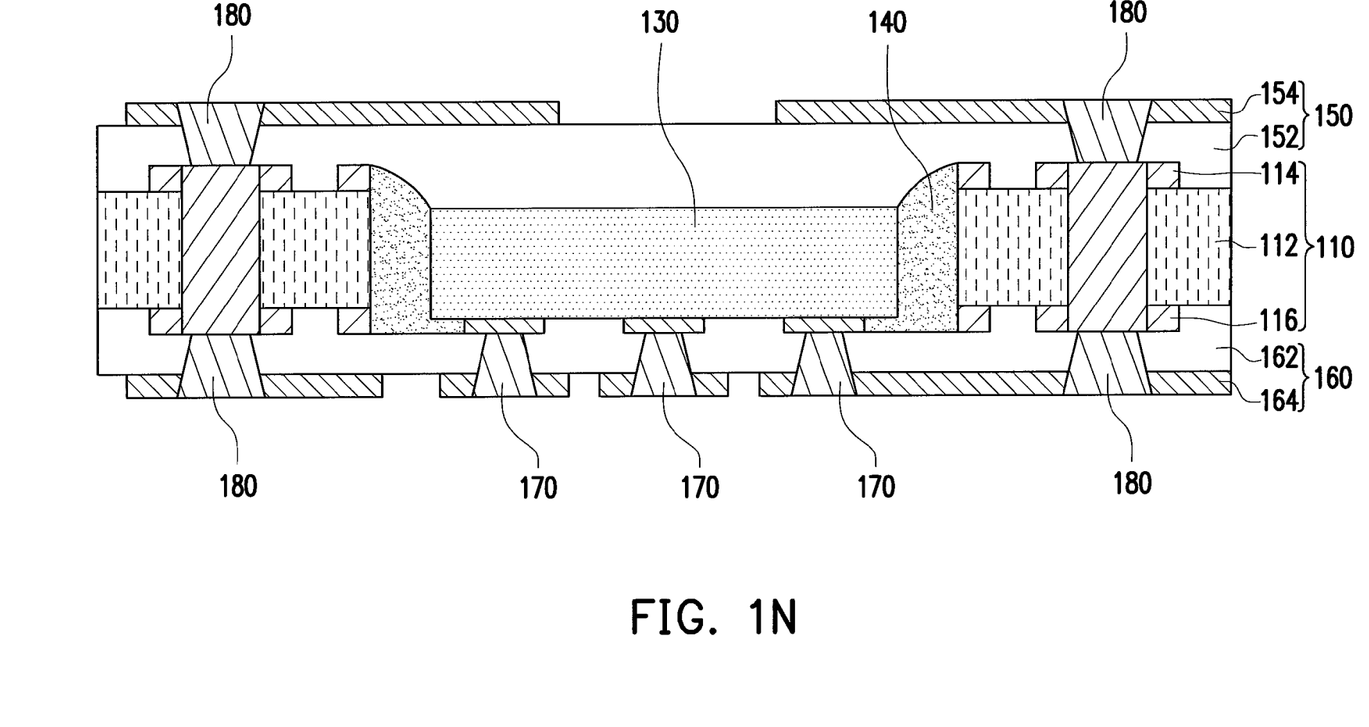

Next, referring to FIG. 1N, a patterning process is performed on the first circuit layer 154 and the second circuit layer 164. Then, referring to FIG. 1O, a patterned solder mask layer 192 is respectively formed on the first stacked layer 150 and the second stacked layer 160, wherein the patterned solder mask layer 192 exposes a part of the first circuit layer 154 and the second circuit layer 164. In addition, the present embodiment may further have a surface finishing layer 194 respectively formed on the part of the first circuit layer 154 and the second circuit layer 164 exposed by the patterned solder mask layer 192. In addition, the patterned solder mask layer 192 may further expose the surface of the first conductive vias 170 and the second conductive vias 180, and the surface finishing layer 194 then covers the first conductive vias 170 and the second conductive vias 180 exposed by the patterned solder mask layer 192. In the present embodiment, a material of the surface finishing layer 194 include nickel, palladium, gold and a combination of the alloys thereof, but of course it should not be construed as a limitation to the invention. In roughly this way, the manufacturing of the package structure 100 is completed.

Structure wise, the package structure 100 formed by the manufacturing method described above may include a substrate 110, a semiconductor component 130, a filling compound 140, a first stacked layer 150 and a second stacked layer 160 as shown in FIG. 1O. The substrate 110 includes a through cavity C1, a core layer 112, a first patterned metal layer 114 and a second patterned metal layer 116. The first patterned metal layer 114 and the second patterned metal layer 116 are respectively disposed on two opposite surfaces of the core layer 112. The through cavity C1 penetrates the core layer 112, the first patterned metal layer 114 and the second patterned metal layer 116. The semiconductor component 130 is disposed in the through cavity C1, wherein an inner wall of the through cavity C1 and a side surface of the semiconductor component 130 jointly define a groove g1, wherein the width of the groove g1 substantially ranges from 50 μm to 100 μm, and the depth d1 of the groove g1 substantially ranges from 100 μm to 300 μm.

In addition, the filling compound 140 is comprehensively filled in the groove g1. In the present embodiment, a material of the filling component 140 includes epoxy. The first stacked layer 150 is disposed on the first patterned metal layer 114 and covers at least a part of the core layer 112 and the semiconductor component 130. The second stacked layer 160 then is disposed on the second patterned metal layer 116 and covers at least a part of the core layer 112 and the semiconductor layer 130. In the present embodiment, the semiconductor component 130 may be an active component or a passive component, and the type of semiconductor component 130 should not be construed as a limitation to the invention.

More specifically, the first stacked layer 150 includes a first dielectric layer 152 and a first circuit layer 154, and the first stacked layer 150 covers at least a part of the semiconductor component 130 with its own first dielectric layer 152. The second stacked layer 160 includes a second dielectric layer 162 and a second circuit layer 164, and the second stacked layer 160 covers another part of the semiconductor component 130 with its own second dielectric layer 162. In addition, the package structure 100 may further include a plurality of first conductive vias 170 configured to electrically connect the semiconductor component 130 to the first circuit layer 154 or the second circuit layer 164. In the present embodiment, the semiconductor component 130 may be a chip having an active surface and a plurality of solder pads disposed on the active surface, and the first conductive vias 170 are configured to electrically connect the solder pads of the semiconductor component 130 on the first circuit layer 154 or the second circuit layer 164.

In the present embodiment, the package structure 100 further includes a patterned solder mask layer 192 and a surface finishing layer 194, and the patterned solder mask layer 192 is disposed on the first stacked layer 150 and the second stacked layer 160 and a part of the first circuit layer 154 and the second circuit layer 164 are exposed. The surface finishing layer 194 then covers a part of the first circuit layer 154 and the second circuit layer exposed by the patterned solder mask layer 192. In addition, the package structure 100 may further include a plurality of conductive pillars 118 and a plurality of second conductive vias 180, and the conductive pillars 118 penetrate the substrate 110 and electrically connect the first patterned metal layer 114 and the second patterned metal layer 116, and the second via 180 is configured to electrically connect the conductive pillar 118 to the first circuit layer 154 and the second circuit layer 164.

In summary, the invention utilizes the characteristic of increasing mobility of a filling compound after heating to dispense the filling compound above a groove defined by the semiconductor component and the through cavity, such that when the heating process is performed, the filling component dispensed above the groove flows down to uniformly and comprehensively fill the groove with narrow width. Thereby, the known problem of the filling compound not easily filling a groove between the semiconductor component and the through cavity can be prevented, so as to enhance the bonding between the substrate and the semiconductor component, and further enhance product yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package structure, comprising:
   providing a substrate, the substrate includes a core layer, a first patterned metal layer and a second patterned metal layer, and the first patterned metal layer and the second patterned metal layer respectively disposed on two opposite surfaces of the core layer;
   forming a through cavity penetrating the substrate;
   disposing the substrate on a tape carrier;
   disposing a semiconductor component in the through cavity and positioned on the tape carrier, and an inner wall of the through cavity and a side surface of the semiconductor device jointly defining a groove;
   dispensing a filling compound above the groove, wherein a material of the filling compound comprises epoxy;
   performing a heating process for the filling compound to flow toward the tape carrier and comprehensively filling the groove;
   laminating a first stacked layer onto the substrate towards the first patterned metal layer, and the first stacked layer covering at least a part of the semiconductor component;
   removing the tape carrier; and
   laminating a second stacked layer onto the substrate towards the second patterned metal layer, and the second stacked layer covering at least a part of the semiconductor component.

2. The manufacturing method of a package structure as claimed in claim 1, wherein the first stacked layer comprises a first dielectric layer and a first circuit layer, wherein the first dielectric layer covers at least a part of the semiconductor component, and the second stacked layer comprises a second dielectric layer and a second circuit layer, wherein the second dielectric layer covers at least a part of the semiconductor component.

3. The manufacturing method of a package structure as claimed in claim 2, further comprising:
   forming a plurality of first conductive vias, wherein the first conductive vias electrically connect the semiconductor component to the first circuit layer or the second circuit layer.

4. The manufacturing method of a package structure as claimed in claim 2, further comprising:
   each forming a first patterned solder mask layer on the first stacked layer and the second stacked layer, wherein the patterned mask layer exposes a part of the first circuit layer and a part of the second circuit layer.

5. The manufacturing method of a package structure as claimed in claim 4, further comprising:
   each forming a surface finishing layer on the part of the first circuit layer and the part of the second circuit layer exposed by the patterned solder mask layer.

6. The manufacturing method of a package structure as claimed in claim 1, wherein a width of the groove substantially ranges from 50 μm to 100 μm.

7. The manufacturing method of a package structure as claimed in claim 1, wherein a depth of the groove substantially ranges from 100 μm to 300 μm.

8. The manufacturing method of a package structure as claimed in claim 1, wherein a heating temperature of the heating process substantially ranges from 80 degrees to 100 degrees Celsius.

9. The manufacturing method of a package structure as claimed in claim 1, wherein the step of providing the substrate comprises:
   respectively forming a first metal layer and a second metal layer on two opposite surfaces of the core layer; and
   performing a patterning process on the first metal layer and the second metal layer to form the first patterned metal layer and the second patterned metal layer.

10. The manufacturing method of a package structure as claimed in claim 9, wherein the step of providing a substrate further includes:
    forming a plurality of via holes penetrating the core layer, the first metal layer and the second metal layer; and
    filling the via holes with a conductive layer to form a plurality of conductive pillars, wherein the conductive pillars electrically connects the first metal layer and the second metal layer.

11. The manufacturing method of a package structure as claimed in claim 10, further comprising:
    forming a plurality of second conductive vias, electrically connecting the conductive pillars to the first circuit layer and the second circuit layer.

12. A package structure, comprising:
    a substrate, comprising a through cavity, a core layer, a first patterned metal layer and a second patterned metal layer, and the first patterned metal layer and the second patterned metal layer respectively disposed on two opposite surfaces of the core layer, and the through cavity penetrating the core layer, the first patterned metal layer and the second patterned metal layer;
    a semiconductor component, disposed in the through cavity, and an inner wall of the through cavity and a side surface of the semiconductor component jointly defining a groove, wherein a width of the groove substantially ranges from 50 μm to 100 μm;
    a filling compound, comprehensively filled in the groove, wherein a material of the filling compound comprises epoxy;
    a first stacked layer, disposed on the first patterned metal layer and covering at least a part of the core layer and the semiconductor component; and
    a second stacked layer, disposed on the second patterned metal layer and covering at least a part of the core layer and the semiconductor component.

13. The package structure as claimed in claim 12, wherein the first stacked layer comprises a first dielectric layer and a first circuit layer, and the first dielectric layer covers at least a part of the semiconductor component, and the second stacked layer comprises a second dielectric layer and a second circuit layer, and the second dielectric layer covers at least a part of the semiconductor component.

14. The package structure as claimed in claim 13, further comprising:
    a plurality of first conductive vias, electrically connecting the semiconductor component to the first circuit layer or the second circuit layer.

15. The package structure as claimed in claim 13, further comprising:
    a patterned solder mask, disposed on the first stacked layer and the second stacked layer to expose a part of the first circuit layer and a part of the second circuit layer.

16. The package structure as claimed in claim 15, further comprising:
    a surface finishing layer, covering the part of the first circuit layer and the part of the second circuit layer exposed by the patterned solder mask layer.

17. The package structure as claimed in claim 12, wherein a depth of the groove substantially ranges from 100 μm to 300 μm.

18. The package structure as claimed in claim 12, further comprising:
    a plurality of conductive pillars, penetrating the substrate and electrically connecting the first patterned metal layer and the second patterned metal layer.

19. The package structure as claimed in claim 18, further comprising:
    a plurality of second conductive vias, electrically connecting the conductive pillars to the first circuit layer and the second circuit layer.

20. The package structure as claimed in claim 12, wherein the semiconductor component includes an active component or a passive component.

* * * * *